(12) United States Patent
Kim et al.

(10) Patent No.: US 6,456,757 B2
(45) Date of Patent: Sep. 24, 2002

(54) OPTICAL WAVELENGTH DIVISION MULTIPLEXER/DEMULTIPLEXER HAVING ADHESIVE OVERFLOW CHANNELS WITH DAMS TO ACHIEVE TIGHT ADHESIVE BOND

(75) Inventors: Peter K. Kim, Alamo; Sophie Prouteau, Berkeley, both of CA (US)

(73) Assignee: Blaze Network Products, Inc., Dublin, CA (US)

( * ) Notice: Subject to any disclaimer, the term of this patent is extended or adjusted under 35 U.S.C. 154(b) by 28 days.

(21) Appl. No.: 09/785,144

(22) Filed: Feb. 16, 2001

Related U.S. Application Data

(63) Continuation-in-part of application No. 09/347,490, filed on Jul. 2, 1999, now Pat. No. 6,201,908.

(51) Int. Cl.$^7$ .............................................. G02B 6/293
(52) U.S. Cl. ............................ 385/24; 385/33; 385/47; 359/127
(58) Field of Search .............................. 385/14, 15, 24, 385/31, 33, 39, 47, 51, 52; 359/115, 124–127, 131, 137

(56) References Cited

U.S. PATENT DOCUMENTS

| | | | | |
|---|---|---|---|---|
| 4,244,045 A | * | 1/1981 | Nosu et al. ................. 359/129 |
| 4,824,200 A | * | 4/1989 | Isono et al. .................... 385/24 |
| 5,119,454 A | * | 6/1992 | McMahon ................... 359/290 |
| 5,583,683 A | * | 12/1996 | Scobey ........................ 359/127 |
| 5,786,915 A | * | 7/1998 | Scobey ........................ 359/127 |
| 5,835,517 A | * | 11/1998 | Jayaraman et al. .......... 372/101 |
| 5,859,717 A | * | 1/1999 | Scobey et al. .............. 359/124 |
| 5,894,535 A | * | 4/1999 | Lemoff et al. ................ 385/14 |
| 6,118,912 A | * | 9/2000 | Xu .............................. 359/124 |
| 6,122,417 A | * | 9/2000 | Jayaraman et al. ........... 372/50 |

* cited by examiner

Primary Examiner—Akm E. Ullah
Assistant Examiner—Michelle R. Connelly-Cushwa
(74) Attorney, Agent, or Firm—Bruce H. Johnsonbaugh

(57) ABSTRACT

An optical wavelength division multiplexer and demultiplexer is provided wherein the optical couplings and alignment of the device are achieved by forming and adhesively joining a prefabricated optical block to a molded coupling module to avoid post-fabrication alignment and adjustment of the optical pathway otherwise required. One or more adhesive overflow channels are formed in said upper surface of the molded coupling module to receive excess adhesive used to join the optical block to the molded coupling module. Dams are formed adjacent each of said adhesive overflow channels to contain adhesive used to join the optical block to the molded coupling module, and to facilitate the use of low viscosity adhesive which in turn achieves a tighter, more parallel bond between the adhesively bonded parts.

3 Claims, 5 Drawing Sheets

OPTICAL WAVELENGTH DIVISION MULTIPLEXER/DEMULTIPLEXER HAVING ADHESIVE OVERFLOW CHANNELS WITH DAMS TO ACHIEVE TIGHT ADHESIVE BOND

CROSS-REFERENCE TO RELATED APPLICATION

This is a continuation-in-part of U.S. patent application Ser. No. 09/347,490 filed Jul. 2, 1999 now U.S. Pat. No. 6,201,908.

BACKGROUND AND BRIEF SUMMARY OF THE INVENTION

The present invention relates generally to optical wavelength division multiplexers/demultiplexers (WDM). More specifically, the present invention relates to optical multiplexers/demultiplexers wherein the device incorporates two primary components which are adhesively bonded to form an optic module. The present invention provides specially designed adhesive overflow channels with dams formed on the upper surface of a molded coupling module to which an optical block is adhesively mounted. The invention facilitates the use of low viscosity adhesive which in turn reduces the thickness of the adhesive bond between the major pieces, thereby achieving a tighter bond and better alignment of the optics.

The present invention is particularly effective in achieving a tighter and more parallel bond between the optical block and molded coupling module components in the multiplexer/demultiplexer design shown and described in U.S. application Ser. No. 09/347,490, which is incorporated by reference herein as though set forth in full. The design shown in Ser. No. 09/347,490 incorporates a pattern of relief cuts wherein each relief cut extends through the exterior side wall of the molded coupling module. Those relief cuts did not allow the use of relatively low viscosity adhesive being used to join the primary two components of the device together, because the low viscosity adhesive would drip down the sides of the module, potentially contaminating the optical pathway extending through the lower surface of the module. Using a high viscosity adhesive limits the closeness of the adhesive bond between the two components and limits the degree of parallelism between those components achievable by the adhesive bond.

The present invention provides a new modified form of adhesive overflow channel which allows the use of a much lower viscosity adhesive. The use of the low viscosity adhesive reduces the thickness of the adhesive joint, increasing the degree of parallelism between the lower surface of the optical block and the upper surface of the molded coupling module. Increasing the parallelism between those components significantly enhances the optical alignment and operational characteristics of the assembled multiplexer/demultiplexer.

A primary object of the invention is to provide an improved design for achieving a very thin adhesive bond between the two primary components of an optical multiplexer/demultiplexer, enhancing the optical alignment characteristics of the assembled device.

A further object of the invention is to provide one or more adhesive overflow channels between an upper and lower optical component wherein the performance of the assembled device is enhanced by achieving the thinnest possible adhesive bond between components.

Another object of the invention is to provide adhesive overflow channels wherein each channel has a dam formed near the outermost edge of the lower optical component to facilitate the use of low viscosity adhesive and to prevent the adhesive from spilling over the outermost edges of the optical component and potentially contaminating the optical pathway of the WDM.

Other objects and advantages will become apparent from the following description and the drawings wherein:

DETAILED DESCRIPTION OF THE DRAWINGS

Figure 1:
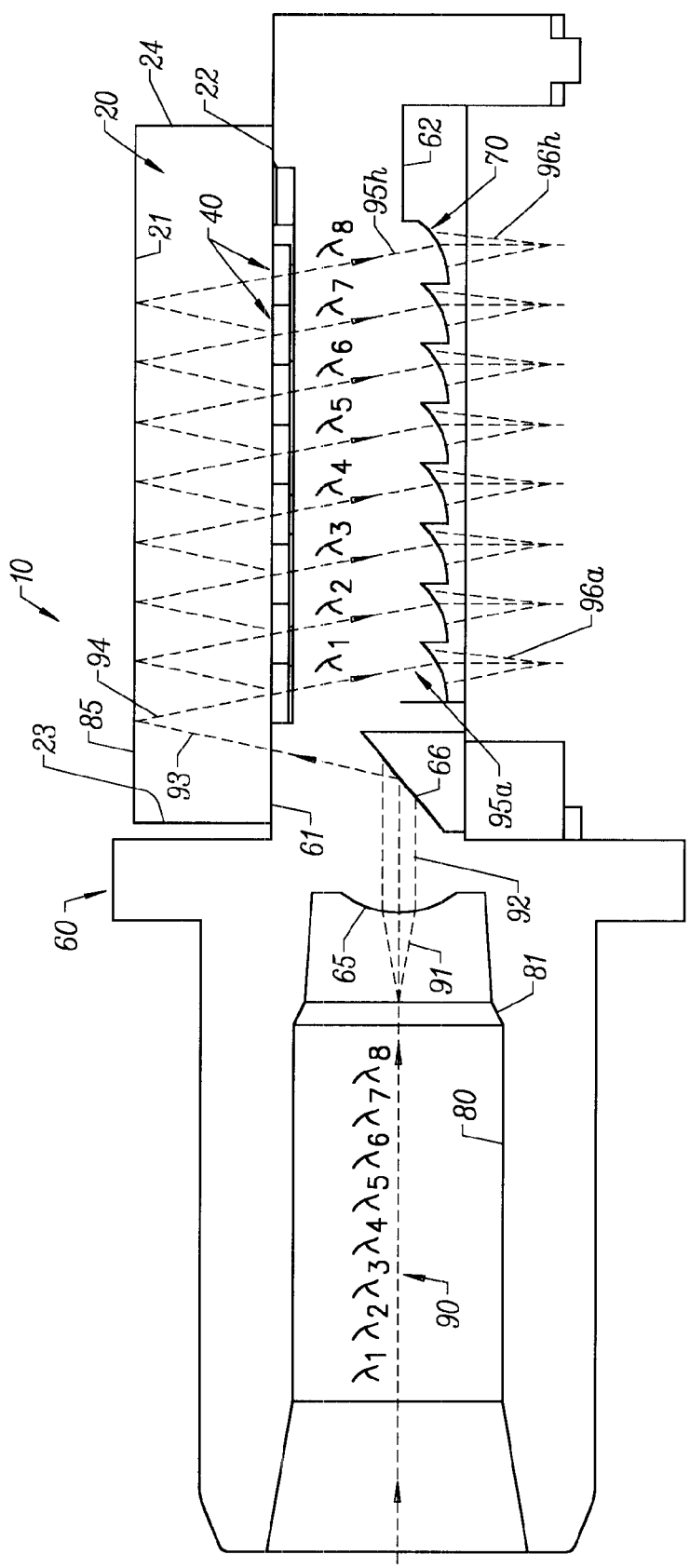
FIG. 1 shows a cross section side view of a WDM optical multiplexer/demultiplexer using the present invention.

FIG. 1 shows the assembled wavelength division multiplexer/demultiplexer 10 which utilizes the present invention. A complete description of the device shown in FIG. 1 is contained in application Ser. No. 09/347,490. A portion of that description is repeated here for convenience. The device shown in FIG. 1 has the ability to combine individual light signals into a single optical path which can be directed towards an optical fiber, and/or demultiplex such signals into individual channels. For simplicity of explanation, the demultiplexing functionality is described, since those skilled in the art will readily understand the correlative multiplexing functionality.

FIG. 1 shows the assembled primary components and illustrates the optical pathway 90–96 wherein an incoming signal includes eight separate wavelengths (n wavelengths in the general case), which are separated into eight separate channels to be read by photodetectors (not shown). An optical block 20 formed of glass or molded of plastic is shown with a plurality of filters 40 carried on its lower surface 22. The optical block 20 has an upper flat surface 21 which is coated with a reflective material 85.

A molded coupling module 60 has a flat upper surface 61 which is adhesively connected to the flat lower surface 22 of optical block 20. The present invention facilitates the use of low viscosity adhesive to achieve a thinner and tighter bond between module 60 and optical block 20.

The molded coupling module 60 in the embodiment illustrated in FIG. 1 includes a fiber optic cable receptacle 80 integrally molded therein for receiving the end of a fiber optic cable (not shown) so that the end of the cable engages receptacle seat 81.

As illustrated in FIG. 1, a multiplexed optical beam moves along optical pathway 90, exits the end of the fiber optic cable (not shown) and begins to diverge as shown at 91. An integrally molded collimating lens 65 collimates the diverging light beam 91 and forms a collimated beam 92. The collimated light beam 92 is reflected off integrally formed reflective surface 66 of the molded coupling module 60 and is directed upwardly toward the reflective coating 85 carried by the flat upper surface 21 of the optical block 20. As the light beam moves through that section 93 of the optical pathway, it impinges against the reflective coating 85 at a predetermined angle of incidence as known in the art. The reflected beam 94 is reflected in a zigzag pattern in optical block 20 between the plurality of n filters 40 and the reflective surface 85 as is known in the art. As the reflected beam enters each of the n filters, one of the n different wavelengths of light is transmitted through each filter arid the separated wavelengths move along the optical pathways 95a through 95h toward the plurality of molded aspheric surfaces 70 formed on the lower surface 62 of the molded coupling module 60. Each of the n aspheric molded surfaces focuses the separated wavelength bands or channels 96a–96h onto separate photodetectors (not shown), as known in the art.

As shown in FIG. 1, the optical block 20 is generally rectangular in shape having flat upper and lower surfaces 21 and 22, a flat proximal end wall 23 and a flat distal wall 24. The optical block in the preferred embodiment of the invention is formed from a high quality optical glass. Alternately, the optical block 20 may be injection molded using high quality optical plastic. The reflective coating 85 is applied to the upper surface 21 of block 20. The reflective coating may be formed of materials conventionally used in this art, such as dielectric interference coatings or metallic coatings.

The optical block 20 has a reflective coating on one side and an array 40 of discrete multiwavelength Fabry-Perot transmission filters on the other side. The precision optical block 20 can be formed of any transparent optical material capable of transmitting light over the desired spectral region and being formed or polished to-the correct thickness. The reflective surface 85 can be placed on the optical block by a number of techniques, to include; dielectric interference coatings, metallic coatings, etc.

The plurality of n filters 40 includes eight discrete Fabry-Perot filters mounted on the flat bottom surface 22 of optical block 20.

The assembly of the filter array onto the optical block and then the adhesive bonding of the optical block 20 to the molded coupling module 60 achieves a passive optical alignment of the critical optical elements of the device. When assembled as described above, the output beam 91 of the fiber optic cable is directly coupled to the wavelength division multiplexer/ demultiplexer 10 and is automatically and passively aligned with the internal optics of the device, including the collimating lens 65, the beam reflection means, the reflective coating 85 on the top surface of optical block 20 as well as with the plurality of filters 40 and the plurality of aspheric surfaces 70. No postfabrication alignment or tuning or adjustment of these optical elements is required.

Figure 2:
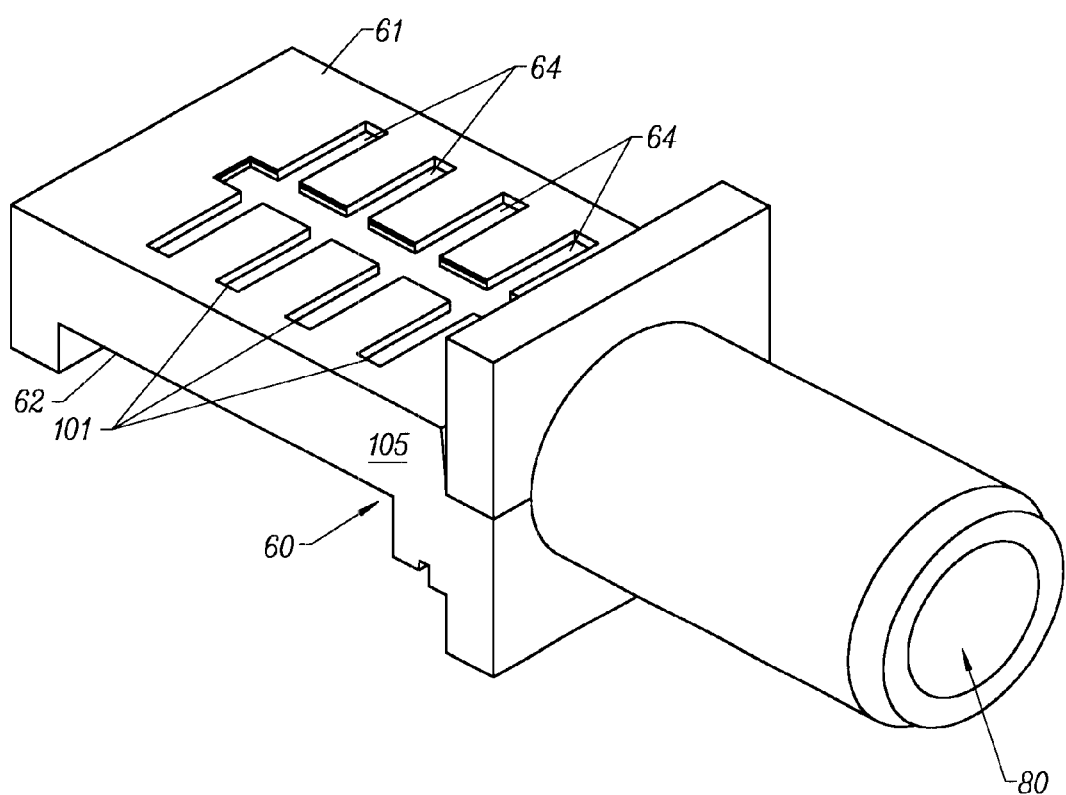
FIG. 2 is a perspective view showing the molded coupling module having the pattern of adhesive overflow channels formed in its upper surface according to the present invention.

FIG. 2 illustrates the molded coupling module 60 before it is adhesively bonded to optical block 20. A series of adhesive overflow channels 64 are formed in the upper flat surface 61 of module 60. The channels,64 are adapted to receive excess adhesive used to join the optical block 20 to the molded coupling module 60. According to the present invention, each channel 64 has a dam 101 formed between the channel 64 and the outer edge surface 105 of the molded coupling module 60. The purpose of dams 101 is to prevent adhesive from running outwardly along channel 64 and downwardly along the edge surface 105 where it can possibly contaminate the optical pathway by reaching the aspherical lens surface 70 (FIG. 1). By forming a dam at the end of each adhesive overflow channel 64, the use of low viscosity adhesive is facilitated.

Figure 3:
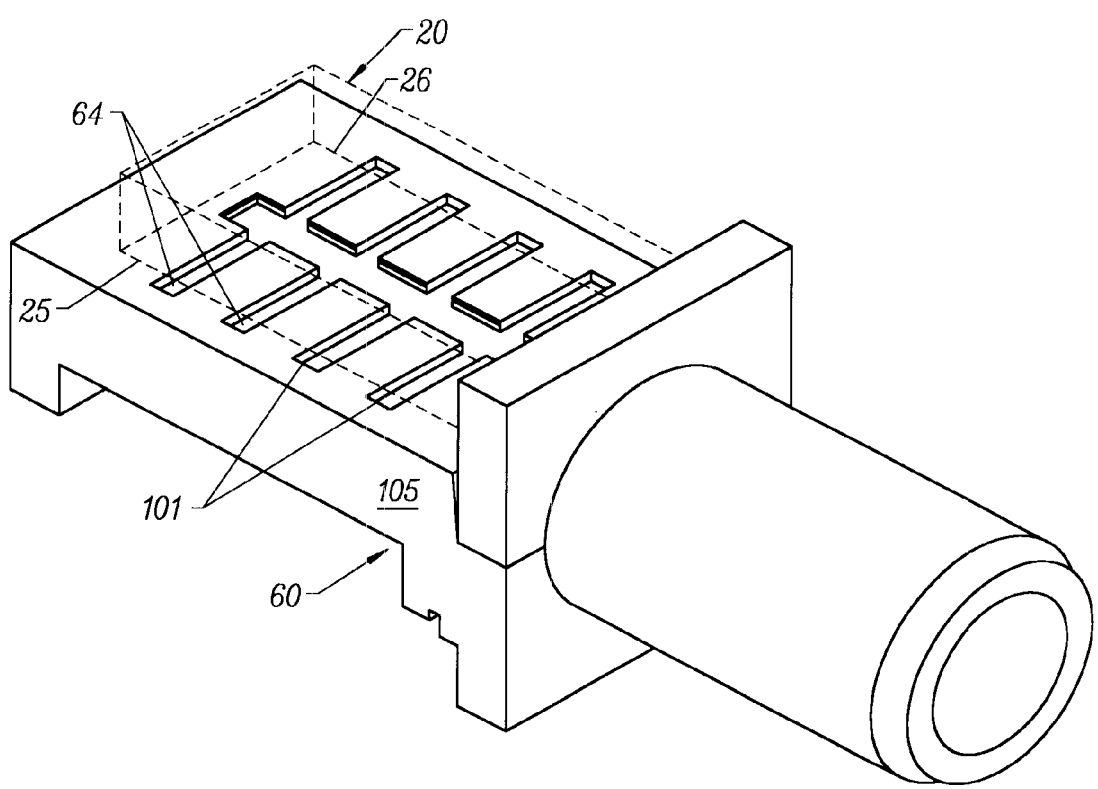
FIG. 3 is a perspective view showing the optical coupling module with the optical block shown in phantom in its ultimate position adhesively bonded to the molded coupling module.

FIG. 3 illustrates the optical block 20 shown in phantom in the position in which it is adhesively bonded to the optical coupling module 60. The outer ends of channels 64 extend outwardly beyond the lateral side walls 25 and 26 of optical block 20.

Figure 4:
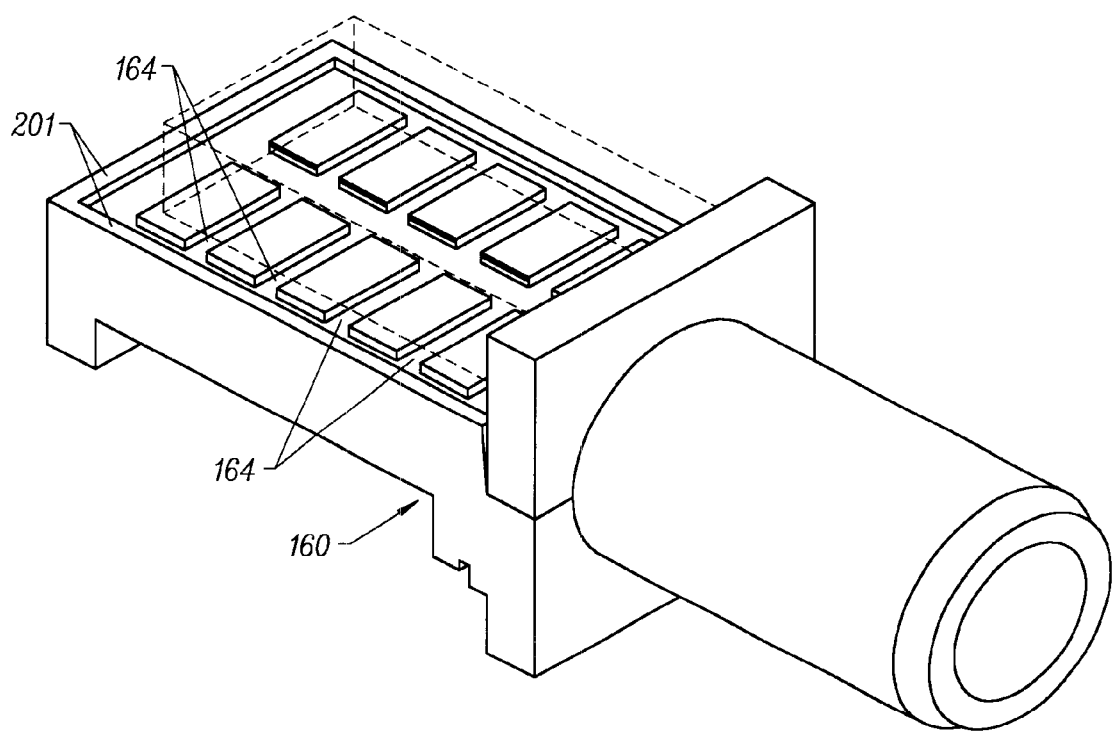
FIG. 4 is a perspective view showing an alternate embodiment of the present invention wherein a continuous dam is formed around the periphery of the upper surface of the molded coupling module.

FIG. 4 illustrates an alternate form of the invention wherein the molded coupling module 160 has a continuous dam 201 extending around the. periphery of its upper surface. The purpose of the continuous dam 201 is to prevent excess adhesive from running downwardly over the outside edges of molded coupling module 160. One or more adhesive overflow channels 164 are formed in the upper surface of molded coupling module 160 to receive excess bonding adhesive.

Figure 5:
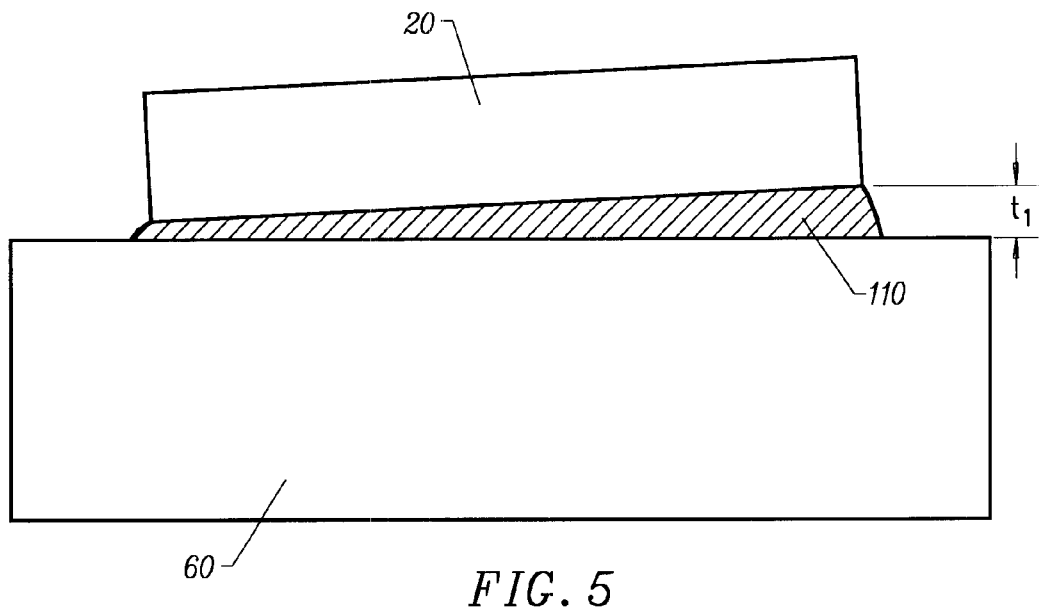
FIG. 5 is a schematic illustration showing in exaggerated form how the optical block may become misaligned on top of the molded coupling module when using relatively high viscosity adhesive.

FIG. 5 illustrates in exaggerated form how the optical block 20 may become somewhat misaligned on molded coupling module 60 when using a high viscosity adhesive 110 having a thickness $t_1$. Optical block 20 may become somewhat misaligned with respect to molded coupling module 60. Any rotation of optical block 20 relative to molded coupling module 60, as illustrated in FIG. 5, can seriously affect the alignment of the optical pathway and the overall performance of the assembled device.

Figure 6:
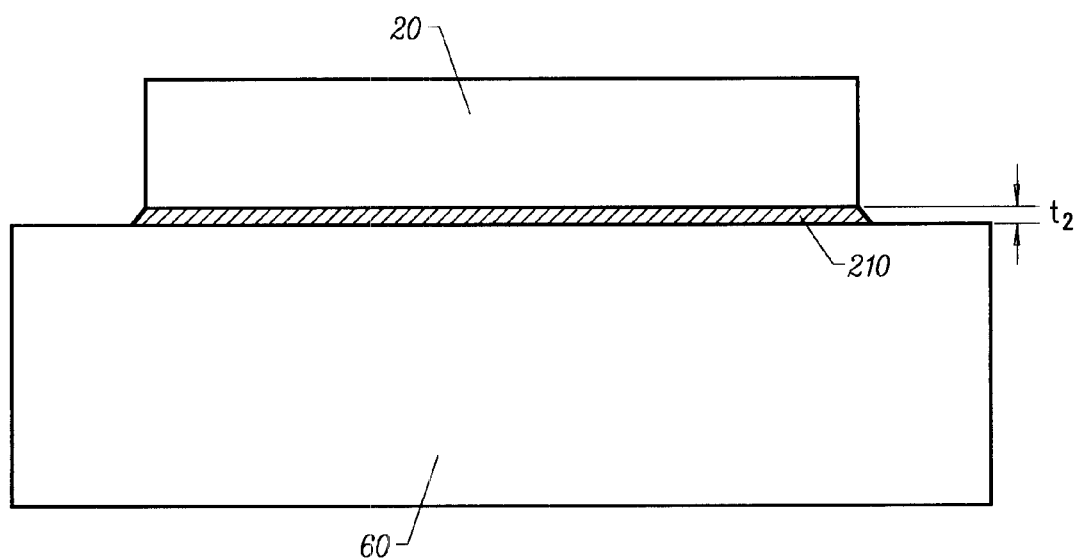
FIG. 6 is a schematic illustration showing in exaggerated form the tighter and more parallel alignment of the optical block on top of the molded coupling module when using low viscosity adhesive.

FIG. 6 illustrates how the use of a low viscosity adhesive 210 achieves a much thinner adhesive layer having a thickness $t_2$ substantially less than $t_1$. The reduced thickness of the adhesive bond increases the parallelism between optical block 20 and molded coupling module 60. The increased degree of parallelism between the optical block 20 and molded coupling module 60 is particularly important in the present invention wherein the devices are capable of high speed automatic assembly and wherein bonding of the optical block 20 to the molded coupling module 60 achieves passive alignment of the optical elements and no post assembly optical alignment is required.

The foregoing description of the invention has been presented for purposes of illustration and description and is not intended to be exhaustive or to limit the invention to the precise form disclosed. Modifications and variations are possible in light of the above teaching. The embodiments were chosen and described to best explain the principles of the invention and its practical application to thereby enable others skilled in the art to best use the invention in various embodiments and with various modifications suited to the particular use contemplated. The scope of the invention is to be defined by the following claims.

What is claimed is:

1. In an optical wavelength division multiplexer and demultiplexer for single-mode or multi-mode fiber optical communications systems, wherein n channels are transmitted through a single fiber optic cable having n different wavelengths and wherein the optical couplings, lenses and alignment of the device are achieved by forming and adhesively joining of prefabricated parts to avoid post-fabrication alignment and adjustment of the optical pathway otherwise required, comprising:

an optical block having a flat upper surface and a flat lower surface, a reflective coating carried by said upper surface of said optical block, a molded coupling module having a flat upper surface on which said flat lower surface of said optical block is mounted, said molded coupling module also having a lower surface on which a plurality of n aspheric lens surfaces is carried, a fiber optic cable receptacle for receiving the end of said fiber optic cable, a collimating lens optically aligned with said fiber optic cable receptacle, and beam reflecting means between said collimating lens and said flat upper surface of said molded coupling module, wherein each of n channels passes through one of said n aspheric lens surfaces, the improvement comprising:

one or more adhesive overflow channels formed in said upper surface of said molded coupling module, said channels being adapted to receive excess adhesive used to join said optical block to said molded coupling module, and dam means formed adjacent each of said adhesive overflow channels to contain adhesive used to join said optical block to said molded coupling module.

2. The apparatus of claim 1 wherein said adhesive overflow channel or channels facilitates the use of lower viscosity adhesive which in turn achieves a tighter and more parallel bond between said optical block and said molded coupling module.

3. The apparatus of claim 1 wherein said dam means comprises a single, continuous dam formed along the periphery of the upper surface of said molded coupling module.

* * * * *

UNITED STATES PATENT AND TRADEMARK OFFICE
CERTIFICATE OF CORRECTION

PATENT NO.    : 6,456,757 B2                                                Page 1 of 1
DATED         : September 24, 2002
INVENTOR(S)   : Peter K. Kim et al.

It is certified that error appears in the above-identified patent and that said Letters Patent is hereby corrected as shown below:

Column 3,
Line 15, change "arid" to -- and --

Signed and Sealed this

Eleventh Day of February, 2003

JAMES E. ROGAN
*Director of the United States Patent and Trademark Office*